(12) United States Patent
Konishi et al.

(10) Patent No.: US 8,138,679 B2
(45) Date of Patent: Mar. 20, 2012

(54) ORGANIC ELECTROLUMINESCENT LIGHT EMITTING DEVICE FOR RESTORING NORMAL OPERATION AFTER LOW-VOLTAGE ERRORS

(75) Inventors: Hirofumi Konishi, Osaka (JP); Shin Ukegawa, Kyoto (JP); Minoru Maehara, Osaka (JP); Masanao Okawa, Nara (JP); Hirofumi Takaki, Aichi (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 441 days.

(21) Appl. No.: 12/412,344

(22) Filed: Mar. 26, 2009

(65) Prior Publication Data
US 2010/0045193 A1    Feb. 25, 2010

(30) Foreign Application Priority Data
Mar. 26, 2008    (JP) .................... 2008-080240

(51) Int. Cl.
H05B 37/02    (2006.01)
G09G 3/32    (2006.01)

(52) U.S. Cl. ............... 315/185 R; 315/294; 315/310; 345/82; 345/84; 345/46; 345/204

(58) Field of Classification Search .......... 315/185 R, 315/129, 144, 210, 294, 299–302, 307, 308; 345/82, 84, 46, 204
See application file for complete search history.

(56) References Cited

U.S. PATENT DOCUMENTS

| | | | | |
|---|---|---|---|---|
| 7,427,970 | B2* | 9/2008 | Iguchi | 345/76 |
| 2002/0163514 | A1* | 11/2002 | Nagai et al. | 345/204 |
| 2005/0057580 | A1* | 3/2005 | Yamano et al. | 345/690 |
| 2006/0273734 | A1* | 12/2006 | Inoue | 315/129 |
| 2006/0290623 | A1* | 12/2006 | Okabe et al. | 345/82 |

FOREIGN PATENT DOCUMENTS

| | | |
|---|---|---|
| JP | 2007-149463 | 6/2007 |
| JP | 2007-207703 | 8/2007 |
| JP | 2007-200662 | 9/2007 |

* cited by examiner

*Primary Examiner* — Vibol Tan
(74) *Attorney, Agent, or Firm* — Waddey & Patterson, P.C.; Mark J. Patterson; Gary L. Montle

(57) ABSTRACT

Provision of a light emitting device having functionality for restoring to normal even if a low-voltage error occurs, by temporarily applying a reverse current to a low-voltage error light emitting element using a direction inverting circuit, and repairing portions in which impedance has fallen by applying the current.

An illuminating device of a light emitting device using a lamp (light emitting element) is provided with a control power source circuit for generating a control voltage, a step-down chopper circuit for converting a direct-current voltage into power needed for the lamps comprising organic electroluminescent elements as light emitting elements, a lamp current detecting circuit for detecting a current flowing to the lamps, a direction inverting circuit including a plurality of lamps and capable of inverting the direction of the connection of the plurality of lamps, a control circuit for generating a control signal for supplying desired power to the lamps, and the lamp current command circuit for controlling the current flowing to the lamps.

19 Claims, 10 Drawing Sheets

Normal State

Error State (a) Pin2
(b) OP2 − terminal
(c) OP2 + terminal
(d) OP2 Output

FIG. 2(a,b,c,d)

Normal State

FIG. 7(a,b,c,d,e,f,g,h,i)

ORGANIC ELECTROLUMINESCENT LIGHT EMITTING DEVICE FOR RESTORING NORMAL OPERATION AFTER LOW-VOLTAGE ERRORS

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

CROSS-REFERENCES TO RELATED APPLICATIONS

This application claims benefit of the following patent application(s) which is/are hereby incorporated by reference: Japanese Patent Application No. JP2008-080240, filed Mar. 26, 2008.

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND OF THE INVENTION

The present invention relates to an organic electroluminescent (EL) light emitting device and lighting equipment for performing current control of light emitting elements, and, in particular, relates to an organic electroluminescent light emitting device and lighting equipment having functionality for restoring to normal even if a low-voltage error occurs, by temporarily applying a reverse current to a low-voltage error light emitting element using a direction inverting circuit, and repairing portions in which impedance has fallen by applying the current.

In recent years, lighting equipment using organic electroluminescent devices that control a current flowing to light emitting elements at a fixed level have become known. Organic electroluminescent devices are devices which take advantage of a phenomenon in which light emission occurs due to excitons, which are created when electrons inserted into an organic material recombine with positive holes. In recent years, there has been a great deal of development of displays using organic electroluminescent devices. This is because organic electroluminescent devices have a wider viewing angle, faster response speed, and greater contrast than liquid crystal display devices.

Organic LED devices generally have a structure in which an organic layer is sandwiched between a negative pole and the positive pole. When a voltage is applied, electrons are injected as carriers from the negative pole, and positive holes are injected as carriers from the positive pole. When these recombine inside the organic layer, excitons are created and light emission occurs.

These kinds of organic electroluminescent devices are generally provided with an organic layer containing a light emitting layer, a positive hole transport layer or an electron transport layer, etc., and a pair of electrodes (negative pole and positive pole) disposed opposite one another with the organic layer in between. The organic layer normally has an extremely thin layer thickness of around 100 nm, for example. Accordingly, there is the risk of leaks between the electrodes or a lack of sufficient voltage insulation between the electrodes due to the presence of particulate matter or inconsistencies in the formation of the organic layer, to name a few examples.

When such problems occur, black spots, and dark or black lines are visible when the organic electroluminescent device is driven, thus reducing the display quality of the organic electroluminescent device. Even if black spots or the like are not visible, if there is insufficient voltage insulation anywhere there is the risk of current leakage when the organic electroluminescent device is driven. In particular, there has been a tendency for the occurrence of such problems to become more probable as organic electroluminescent devices have grown in size in recent years. This is a major problem.

In light of this situation, a method is known for fixing insulation problems between the pairs of electrodes in organic electroluminescent devices provided with a plurality of types of organic layer containing at least light emitting layers with mutually differing colors of emitted light, and pairs of electrodes disposed opposite one another with the plurality of types of organic layer in between, by insulating the badly insulated portions through application of a reverse bias voltage to the plurality of types of organic layer under differing application conditions for each color of emitted light, for example.

A manufacturing method for an organic electroluminescent element is known in which a laminated body comprising an organic layer containing a positive pole, a light emitting layer, and a negative pole, laminated in sequence, is formed on a substrate, the negative pole being formed by disposing in sequence a first conductive layer, a buffer layer, and a second conductive layer, and aging the laminated body after formation.

With this, it is possible to manufacture an organic electroluminescent element with a lower drive voltage than is conventional, by laminating in sequence the first conductive layer, the buffer layer, and the second conductive layer to form the negative pole, and then aging the laminated body after formation.

Furthermore, a lighting device has been proposed which is provided with a direct current power source means for supplying desired direct current voltage to an organic electroluminescent element, a detecting means for detecting stoppage of the voltage supply by the direct current power source means, and the reverse voltage supplying means for supplying reverse-characteristic voltage to the organic electroluminescent element when voltage supply by the direct current power source means has stopped.

BRIEF SUMMARY OF THE INVENTION

Organic electroluminescent elements used in light emitting elements sometimes suffer from the problem of low-voltage errors in the light emitting elements due to a drop in impedance because of partial current concentration due to manufacturing inconsistencies or light emitting elements being on. Conventional examples simply control the light emitting element current to a fixed level, but have the drawback of being unable to keep light emitting elements on if a low-voltage error has occurred in the light emitting element.

The present invention was devised in light of the above points, and has as an object to provide an organic electroluminescent light emitting device having functionality for restoring to normal even if a low-voltage error occurs, by temporarily applying a reverse current to a low-voltage error light emitting element using a direction inverting circuit, and repairing portions in which impedance has fallen by applying the current.

The light emitting device of the present invention is provided with: a plurality of light emitting elements for emitting light by receiving a supply of direct-current current; a direct-current power source circuit for supplying at least a certain current to the light emitting elements; and a plurality of direction inverting circuits for switching the direction of current allocated to each light emitting element and applied to the light emitting elements using switching elements. The direction inverting circuit also uses the switching elements with the plurality of light emitting elements. When a problem occurs said circuit applies a reverse voltage to any of the plurality of the light emitting elements in which the problem has been detected, and thereafter applies a forward voltage to light emitting elements in which a normal state has been detected.

Thus comprised, a direction inverting circuit is provided which also uses the switching elements with the plurality of light emitting elements, and when a problem is detected in any of the plurality of light emitting elements applies a reverse voltage to light emitting elements in which a problem has been detected, and when a normal state of a light emitting element to which the reverse voltage has been applied is detected applies a forward voltage to light emitting elements in which a normal state has been detected, and therefore can restore normal-state light emitting elements to a normal state without turning them off even if a problem occurs in the light emitting elements.

The direction inverting circuit of the light emitting device is further provided with: a plurality of switching elements for switching the direction of the current applied to the plurality of light emitting elements; a voltage detecting portion for detecting the voltage of the plurality of light emitting elements; a direction inverting circuit controlling portion for turning on and off the plurality of switches based on the voltage of the plurality of light emitting elements detected by the voltage detecting portion; and a drive circuit for driving the plurality of switches according to a signal from the direction inverting circuit controlling portion.

Thus comprised, a direction inverting circuit controlling portion is provided which turns on and off the plurality of switches based on the voltage of the plurality of light emitting elements detected by the voltage detecting portion, and therefore it is possible to restore light emitting elements in which errors have occurred to a normal state by applying a reverse voltage temporarily to problem light emitting elements and thus restoring portions in which impedance is dropped by applying a current.

The plurality of light emitting elements of the light emitting device further include first and second light emitting elements connected in series. The direction inverting circuit includes first, second, and third switch pairs connected in series between power sources, the first light emitting element being connected between series contacts of the first and second switch pairs, and the second light emitting element being connected between series contacts of the second and third switch pairs.

Thus comprised, the first and second light emitting elements can be driven by the first through third switch pairs, and therefore the number of switches in the light emitting device can be kept low.

The voltage detecting portion of the light emitting device further detects low-voltage errors in any of the plurality of light emitting elements, and the direction inverting circuit controlling portion intermittently applies reverse voltage to light emitting elements in which a low-voltage error has been detected.

Thus comprised, the direction inverting circuit controlling portion intermittently applies reverse voltage to light emitting elements in which a low-voltage error has been detected. It is therefore possible to control the amount of current flowing when the reverse voltage is applied by controlling the ON-duty of the intermittent drive, thereby making it possible to restore light emitting elements in which a low-voltage error has occurred to a normal state.

Furthermore, it is possible to maintain the on state of other normal state light emitting elements while reverse voltage is being applied to a light emitting element with a low-voltage error thanks to the intermittent drive. By changing the ON-duty of the intermittent drive, it is possible to control the brightness of the normal-state light emitting elements. In other words, it is possible to suppress brightness by suppressing the current flowing to normal-state light emitting elements by increasing the amount of reverse current applied to problem light emitting elements by raising the ON-duty.

The second switch pair of the light emitting device further includes a switch for causing a forward current to flow to normal-state light emitting elements and causing a reverse current to flow to problem light emitting elements.

Thus comprised, the second switch pair includes a switch for causing a forward current flowing to normal-state light emitting elements to flow and causing a reverse current flowing to problem light emitting elements to flow, and therefore the on state of other normal-state light emitting elements can be maintained while reverse voltage is being applied to low-voltage error light emitting elements.

The plurality of light emitting elements of the light emitting device further contain a number n of lamps connected in series, and the direction inverting circuit includes a number (n+1) of switch pairs connected in series between poles of the power source, the n lamps being connected between series contacts of (n+1) switch pairs.

Thus comprised, the n lamps are connected between series contacts of (n+1) switch pairs, and therefore the number of switches in the light emitting device can be kept low.

The light emitting device is further comprised such that, if the switch connecting the positive pole side of a problem light emitting element and the negative pole of the power source is the low-side switch, and the switch connecting the negative pole side of the problem light emitting element and the positive pole of the power source is a high-side switch, the direction inverting circuit controlling portion causes either or both of the low-side switch and the high-side switch to operate intermittently, thus applying a reverse voltage to problem light emitting elements intermittently.

Thus comprised, the direction inverting current controlling portion causes either or both of the low-side switch and the high-side switch to operate intermittently, thus applying a reverse voltage to problem light emitting elements intermittently, and therefore it is possible to restore to normal light emitting elements in which a low-voltage error has occurred by controlling the amount of current flowing when the reverse voltage is applied by controlling the ON-duty of the intermittent drive.

The light emitting device is further comprised such that either or both of the low-side switch and the high-side switch are controlled so as to apply a forward current to normal light emitting elements in the reverse current to problem lighting emitting elements.

Thus comprised, either or both of the low-side switch and the high-side switch are controlled so as to apply a forward current to normal light emitting elements in the reverse current to problem lighting emitting elements, and therefore the on state of other normal light emitting elements can be maintained while reverse current is being applied to the low-voltage error light emitting elements.

The light emitting device is further comprised such that the direction inverting circuit including n light emitting elements connected in series and (n+1) switch pairs connected in series between power sources is constituted by being connected in m rows.

Thus comprised, the n light emitting elements connected in series are connected in m rows, and therefore it is possible to keep the number of switches in the light emitting element low.

As described herein, a light emitting device is provided comprising: a light emitting element power supplying circuit for adjusting the power supply to a plurality of light emitting elements; a light emitting element voltage detecting circuit for detecting the voltage of the light emitting elements; and a plurality of direction inverting circuits for switching the direction of current applied to the light emitting elements, wherein the direction inverting circuit detects low-voltage errors in light emitting elements with the light emitting element voltage detecting circuit when the light emitting element voltage is less than or equal to a predetermined value, and applies a reverse voltage to light emitting elements thus detected, and also uses some of the adjacent switches of the direction inverting circuit, and therefore can maintain the on state of other normal light emitting elements when applying a reverse voltage to low-voltage error light emitting elements, thereby maintaining a compact size, and having functionality for restoring to a normal state even if low-voltage errors occur.

With the present invention, a light emitting device can be provided with a low number of switches and having functionality for restoring to a normal state even if low-voltage errors occur, as the direction inverting circuit can connect n lighting elements in series, and the number of switches is (2n+2).

With the present invention, a light emitting device can be provided having functionality for restoring to normal state even if low-voltage errors are detected, as the direction inverting circuit detects low-voltage errors in light emitting elements with the light emitting element voltage detecting circuit when the light emitting element voltage is less than or equal to a predetermined value, and performs intermittent drive of some of the switches when applying a reverse voltage to light emitting elements thus detected, and therefore the amount of current can be controlled when applying the reverse voltage.

Furthermore, with the present invention, a light emitting device can be provided with a low number of switches and having functionality for restoring to a normal state even if low-voltage errors occur, as the direction inverting circuit can connect n light emitting elements in series, and can connect the n light emitting elements connected in series in m rows, the number of switches therefore being (m×(2n+n)).

BRIEF DESCRIPTION OF THE SEVERAL VIEWS OF THE DRAWINGS

FIGS. 2a-2d are graphical views showing an operation of generating a drive signal of a switching element Q1 using a comparator OP2 in the embodiment of FIG. 1.

DETAILED DESCRIPTION OF THE INVENTION

Figure 1:
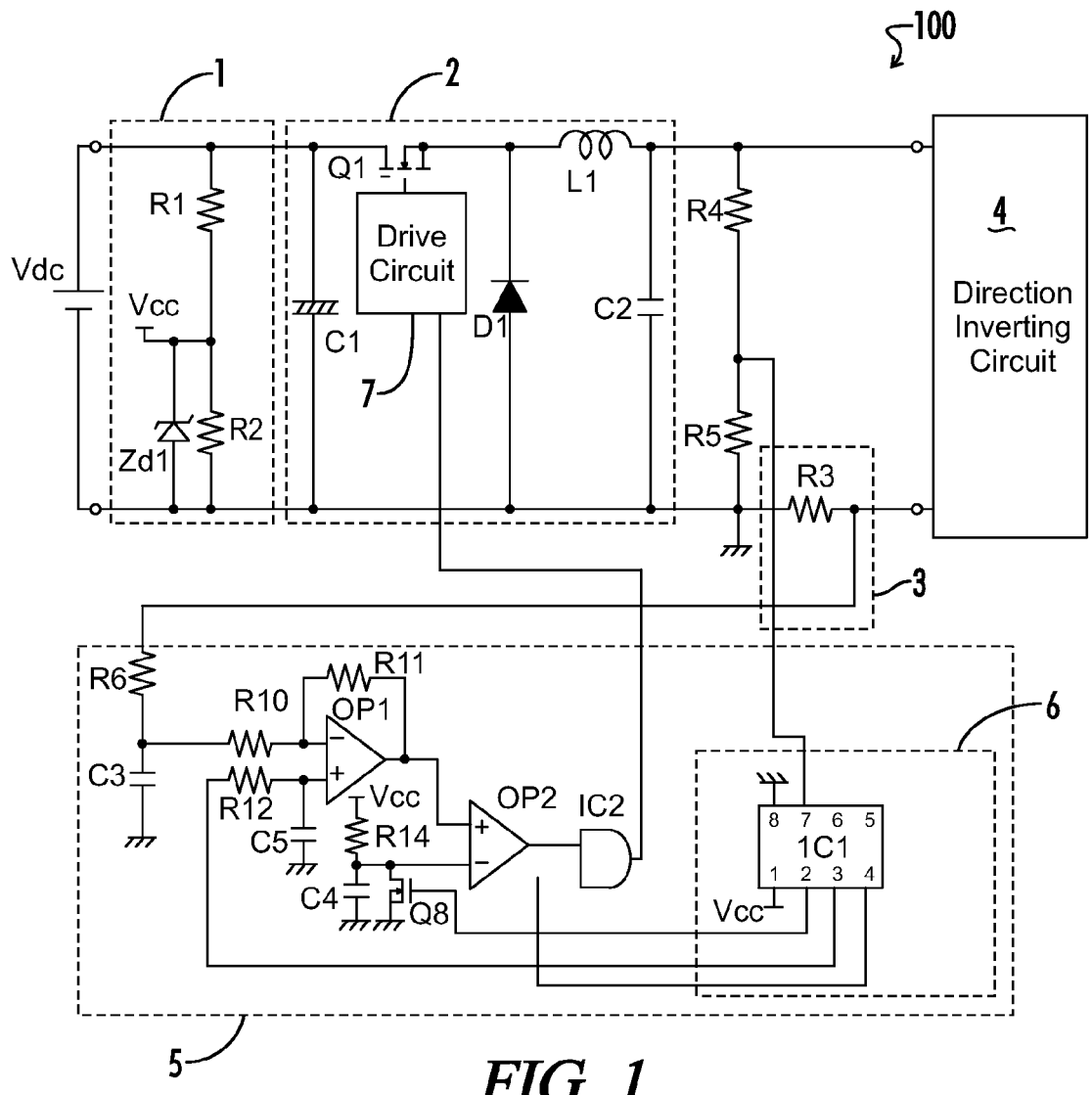
FIG. 1 is a circuit diagram showing a light emitting device 100 according to an embodiment of the present invention.

An embodiment of a light emitting device is herein described, with reference to FIGS. 1-7. As shown in FIG. 1, a light emitting device 100 is comprised of lamps further comprising organic electroluminescent elements as light emitting elements, and a lamp illuminating device for illuminating the lamps. Specifically, the lamp illuminating device of the light emitting device 100 of the present embodiment is provided with a control power source circuit 1 for generating a control voltage, a step-down chopper circuit 2 for converting a direct-current voltage into power needed for the lamps comprising organic electroluminescent elements as light emitting elements, a lamp current detecting circuit 3 for detecting a current flowing to the lamps, a direction inverting circuit 4 including a plurality of lamps and capable of inverting the direction of the connection of the plurality of lamps, a control circuit 5 for generating a control signal for supplying desired power to the lamps, and the lamp current command circuit 6 for controlling the current flowing to the lamps.

The circuits in FIG. 1 are described now in further detail. A direct-current voltage obtained by rectifying and smoothing a commercial alternating-current power source with a step-up chopper circuit, for example, which is not shown in the drawings, is applied to an electrolytic capacitor C1 for applying an on current to lamps as a direct-current power source. This direct-current voltage is maintained at approximately 100 V in the circuit, for example, and this is the lamp loop voltage needed for keeping the lamps comprising the organic electroluminescent elements on.

Note that if two lamps are connected in series in which five organic electroluminescent elements are connected in series, each needing approximately 5-7 V, a voltage of approximately 50-70 V will be needed. If two lamps are connected in series comprising one organic electroluminescence element approximately requiring 5-7 V, then a voltage of approximately 10-14 V will be needed, and therefore a direct-current voltage of approximately 20 V is sufficient. The direct-current power source may be a battery or any other equivalent source for example.

A control power source circuit 1 is made up of voltage dividing resistors R1, R2 and a Zener diode ZD1, and generates a voltage Vcc supplied to a control circuit 5.

The step-down chopper circuit 2 comprises a switching element Q1, a regeneration diode D1, an inductor L1, and a capacitor C2, and the direct-current voltage accumulated in the electrolytic capacitor C1 is converted into the power needed for the lamps when the switching element Q1 switches at a high-frequency.

The control circuit 5 comprises a circuit for outputting a signal Q1 driving circuit 7 upon reception of signals from the lamp current command circuit 6 and the lamp current detecting circuit 3.

The lamp current command circuit 6 sets the lamp peak current value command value. It may be comprised of, for example, a general-purpose microcomputer IC1, such as a Microchip Co., Ltd. PIC12F675 (an 8-bit microcomputer with an A/D conversion function and flash memory), and by monitoring the voltage at the voltage division point of the resistors R4, R5 detects lamp voltage and makes a judgment as to whether or not to turn on a lamp, which is a load, according to the detected value (and also detects for load errors).

Where this microcomputer IC1 is used for example, the seventh pin is set for A/D conversion input, and the lamp voltage value obtained from the loop voltage of the capacitor C2 is read. The second, third, and fourth pins are set to binary output. The first pin is the power terminal, and the eighth pin is the ground terminal.

The control circuit 5 supplies desired power to lamps by controlling the switching element Q1 of the step-down chopper circuit 2. The voltage value of the lamps is detected by the current detecting resistor R3, and a differential amplifier OP1 adjusts the current value.

Specifically, the switching element Q1 of the step-down chopper circuit 2 is adjusted by comparing the voltage output by the differential amplifier OP1 and a triangular-wave signal from the negative pin of a comparator OP2, thereby adjusting the power which is supplied. FIG. 2 shows an operation for generating a drive signal for the switching element Q1 by the comparator OP2.

FIG. 2(a) shows the high and low output from the second pin in the microcomputer IC1, FIG. 2(b) shows the voltage of a capacitor C4 applied to the negative terminal of the comparator OP2, the solid line in FIG. 2(c) shows a reference voltage applied to the positive terminal of the comparator OP2 and the dotted line shows the voltage of the capacitor C4, and FIG. 2(d) shows the output of the comparator OP2. Note that the comparator OP2 in the differential amplifier OP1 can be constituted cheaply with ICs and the like with two built-in operation amplifiers in a single package, and that the control power is supplied from the voltage Vcc.

When the second pin of the microcomputer IC1 is high, the capacitor C4 is shorted by the switching element Q8 being turned on, and the accumulated load is discharged. When the second pin of the microcomputer IC1 is low, the capacitor C4 is charged via the resistor R14 by the switching element Q8 being turned off, and the voltage rises.

The voltage of the capacitor C4 is applied to the negative terminal of the comparator OP2. The output voltage of the differential amplifier OP1 is applied to the positive terminal of the comparator OP2 as a reference voltage. The output of the comparator OP2 is high as long as the voltage of the capacitor C4 is lower than the reference voltage.

Accordingly, the switching element Q1 is turned on and off at a frequency output from the second pin of the microcomputer IC1, and the pulse width increases as the output voltage from the differential amplifier OP1 rises. Therefore, by making the reference voltage of the positive terminal of the differential amplifier OP1 variable, the lamp current value can be adjusted.

An AND circuit IC2 sets the on and off signals to the drive circuit of the switching element Q1 depending on the output of the fourth pins of the microcomputer IC1 and the output of the comparator OP2 using an AND logic element.

Control is provided when applying a direct-current current to a lamp by the output of the fourth pin of the microcomputer IC1 becoming high. When applying a direct-current current to a lamp intermittently (called PWM control), the output of the fourth pin of the microcomputer IC1 is turned on and off at an arbitrary frequency, and the effective value of the lamp current is controlled by varying the ratio of the on time.

Figure 3:
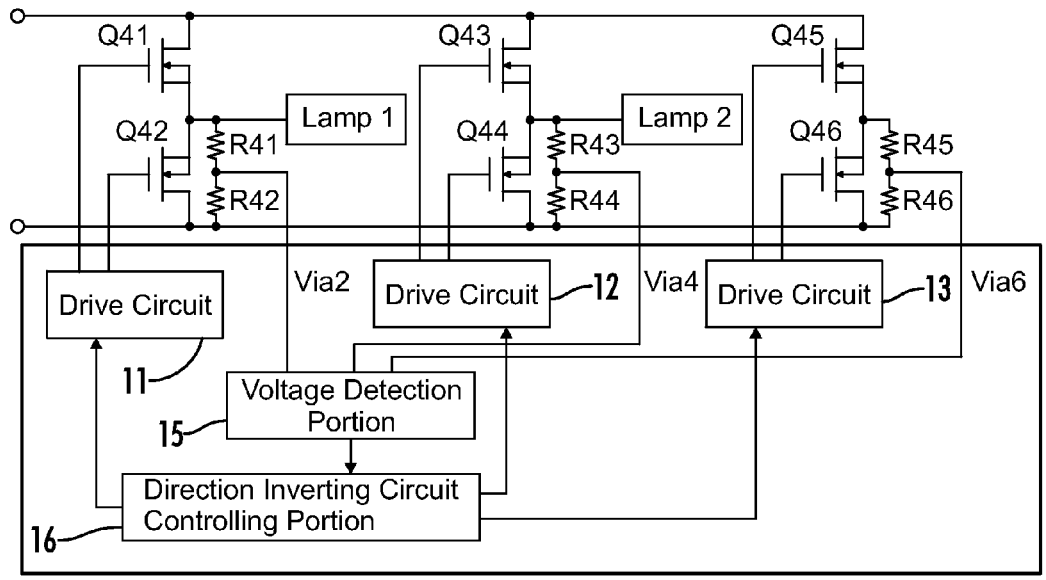
FIG. 3 is a circuit diagram showing a direction inverting circuit 4 according to the embodiment of FIG. 1.

Referring now to FIG. 3A, the direction inverting circuit 4 is comprised of switching elements Q41-Q46, voltage detecting circuits R41-R46, a voltage detecting portion 15 for calculating lamp voltage based on drive circuits 11-13 of the switching elements Q41-Q46 and the voltage detecting circuits R41-R46, and the direction inverting circuit controlling portion 16 for turning the switching elements Q41-Q46 on and off based on the results of the voltage detecting circuit 15. FIG. 3 shows an example of being able to connect two lamps in series (Lamp 1 and Lamp 2 can be connected).

An example is described now of a lamp comprising a plurality of organic electroluminescence elements. Five organic electroluminescent elements requiring a rated voltage of 7 V are connected in series, and therefore the rated voltage per lamp is 35 V and the rated current is 400 mA. Since two lamps are connected in series, the input voltage of the direction inverting circuit 4 is approximately 70 V. The input current of the direction inverting circuit 4 is 400 mA.

When the lamps are kept on, the voltage detecting portion 15 calculates the lamp voltage of Lamp 1 as the difference between V1$a$2 and V1$a$4, and similarly calculates the lamp voltage of Lamp 2 as the difference between V1$a$4 and V1$a$6. If the detected lamp voltage falls below a predetermined voltage (e.g., several volts) which is lower than the constant lamp voltage, this is detected as a low-voltage error in the lamp and the switches Q41-Q46 are controlled such that a reverse voltage is applied to that lamp. The direction inverting circuit controlling portion 16 and the voltage detecting portion 15 may be comprised for example by general-purpose microcomputer ICs, and can share IC1 in FIG. 1.

Operation in the event that Lamp 2, in the example in which two lamps can be connected in series, suffers from a low-voltage error, is now described with reference to the voltage and current waveforms shown in FIG. 7.

Figure 4:
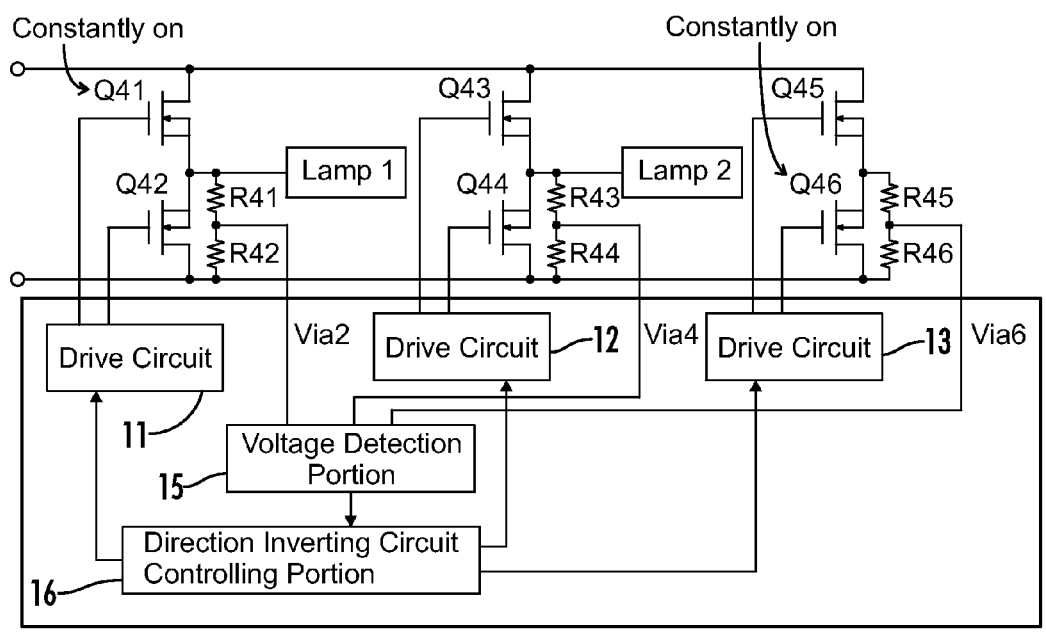
FIG. 4 is a circuit diagram showing a normal state (constant connection) of the direction inverting circuit 4 of FIG. 3.

Referring now to FIG. 4, the direction inverting circuit 4 in a normal state (constant connection) is shown. In this case, Q41 and Q46 are on and all the others are off. Lamp 1 and Lamp 2 are connected in series, and the current flows from Q41 to Q46. A current I1$a$ is controlled so as to be the rated current by the step-down chopper circuit 2.

Specifically, as shown by the voltage waveforms of FIGS. 7(a), (b), and (c), when constantly on, the voltage V1$a$2 of the contact between the resistor R41 and the resistor 42 is V1 with respect to time 0-t1 (horizontal axis), the voltage V1$a$4 of the contact between the resistor R43 and the resistor 44 is V2, and the voltage V1$a$6 of the contact between the resistor R45 and the resistor 46 is 0. Furthermore, as shown by the voltage waveforms of FIGS. 7(d) and (e), the current I1$a$1 flowing through Lamp 1 and the current I1$a$2 flowing through Lamp 2 are both I1$a$. Note that FIG. 7(f)-(i) are the on/off waveforms of the switches Q41, 46, 44, and 45.

As the impedance falls when Lamp 2 undergoes an error, the voltage of Lamp 2 falls, and the low-voltage error is detected as the voltage of Lamp 2 (defined as V1a4-V1a6—note also that V1a6=0) falls below a predetermined voltage which is lower than the lamp voltage when on. In other words, as shown in FIGS. 7(a) and (b), a drop in the voltage V1a2 and the voltage V1a4 is detected during time t1-t2 (error detection).

Figure 5:
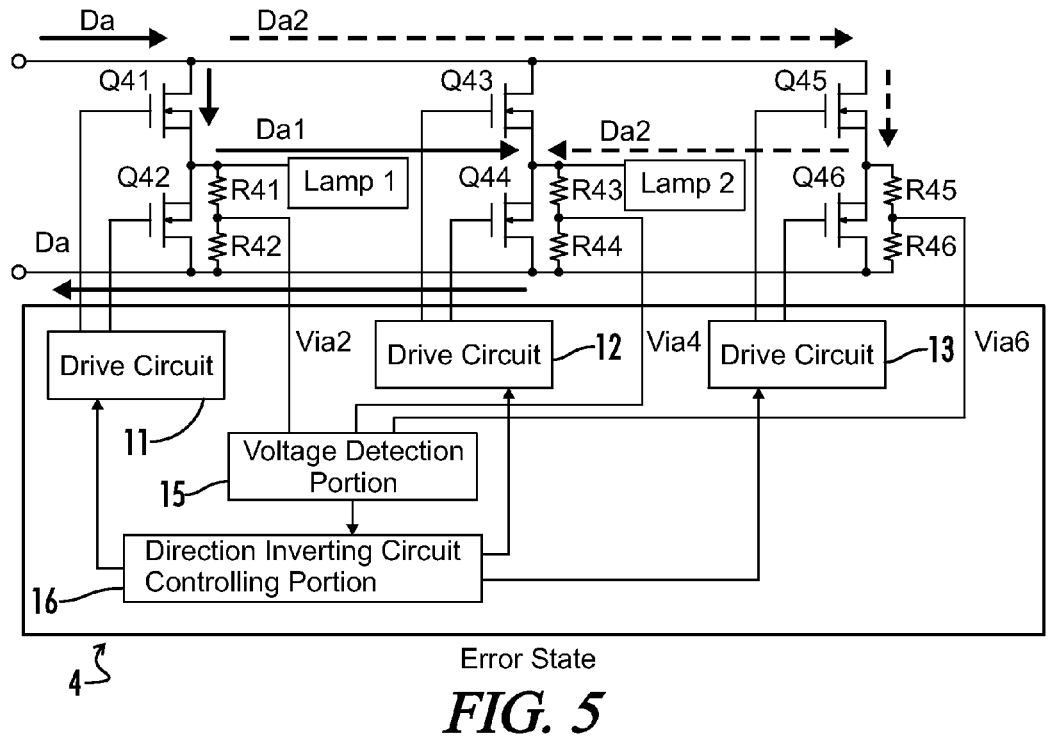
FIG. 5 is a circuit diagram showing an error state (error in Lamp 2) of the direction inverting circuit 4 of FIG. 3.

FIG. 5 shows an example in which Lamp 2 is in error. When Lamp 2 is in error, Q44 is turned on, Q46 is turned off, and Q45 is turned on and off intermittently. Q41 is maintained on. The frequency of the intermittent drive is a frequency sufficient to prevent blinking of the lamp from becoming noticeable (e.g. from several hundred Hz to a few kHz). In this case, when Q45 is on, a reverse voltage is applied to Lamp 2, and when Q45 is off, Lamp 1 is turned on. Q44 is used to apply a reverse current to Lamp 2 and a forward current to Lamp 1.

Namely, time t2-t3 in FIG. 7(a) is the period during which the direction is inverted, and the voltage V1a2 is intermittent. As shown in FIGS. 7(d) and (e), the current I1a1 flowing through Lamp 1 and the current I1a2 flowing through Lamp 2 flow in reverse intermittently.

Figure 7:
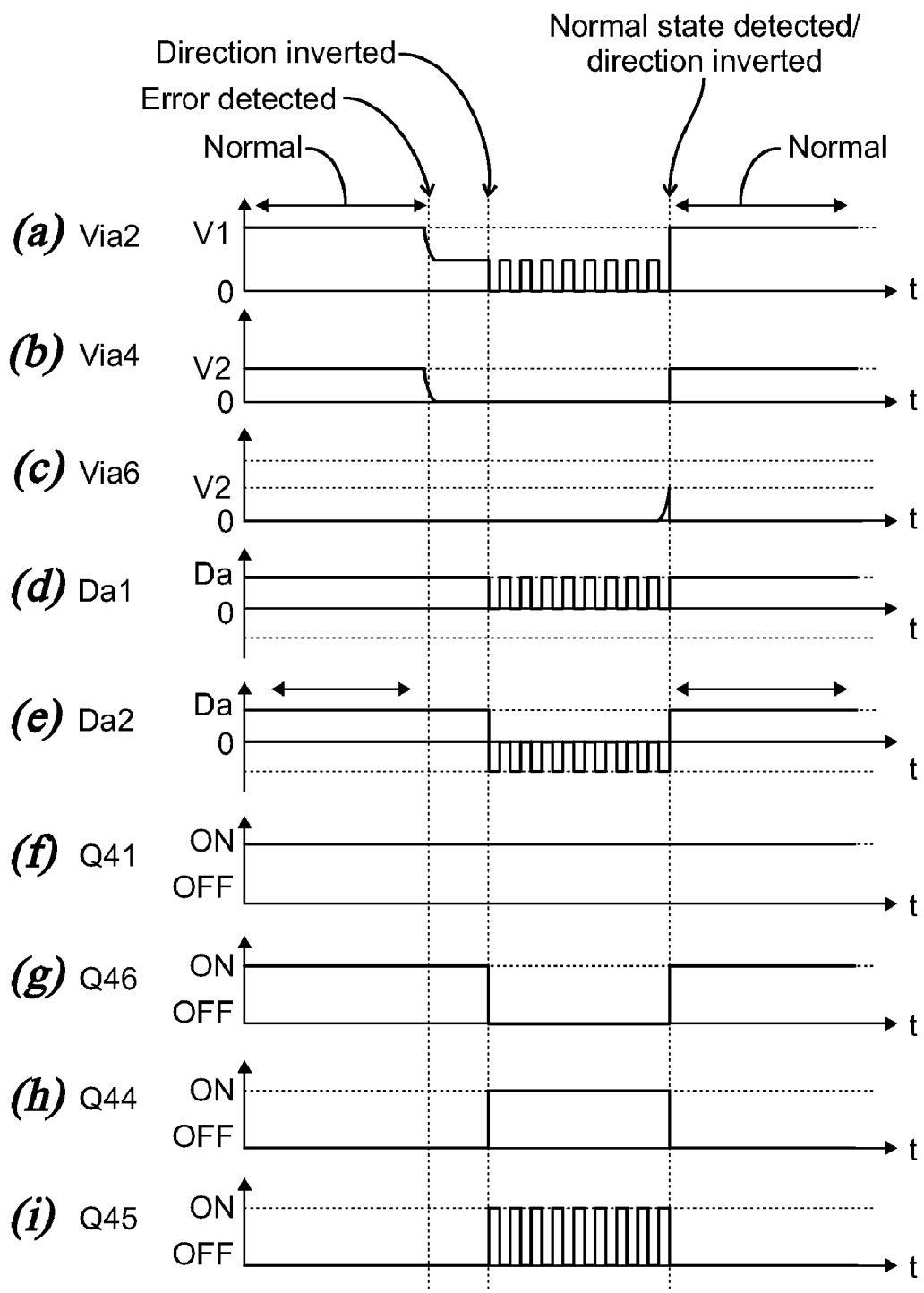
FIGS. 7a-7i are graphical views showing various voltage waveforms and current waveforms of the light emitting device 100 according to the embodiment of FIG. 1.

As shown in FIG. 5, the lamp voltage for Lamp 2 can be calculated with V1a6-V1a4 (note, however, that V1a4=0), and therefore when the lamp voltage rises to a value near the constant voltage (time t3 in FIG. 7), Lamp 2 is deemed to have been restored to normal, and the connection in FIG. 4 is returned to (normal state detection/direction inversion in FIG. 7(a)). The normal state detection is also possible by detecting the lamp current (the reverse potential current stops; I1a2 in FIG. 7(e)).

In this case, the brightness of the normal-state lamps can be controlled by varying the ON-duty of the intermittent drive when there is an error, and it is possible to control the amount of reverse current applied to the error lamps. In other words, raising the ON-duty of Q45 increases the amount of reverse current being applied to problem lamps, thus suppressing the current flowing to normal-state lamps and thus their brightness.

There are six switches in the direction inverting circuit 4 in which two lamps are connected in series, making it possible to use two fewer lamps than in a case in which one direction inverting circuit 4 is used for each lamp. When n lamps are connected in series, the number of switches in the direction inverting circuit 4 is 2n+2, thereby making it possible to reduce the number by 2n−2.

Accordingly, it is possible to provide an organic electroluminescent light emitting device and lighting apparatus having functionality for restoring to a normal state even if a low-voltage error occurs, and to reduce the number of switches in the direction inverting circuit 4. Furthermore, it is possible to provide an organic electroluminescent light emitting device and lighting apparatus capable of maintaining the on state of other normal state lamps even in a case in which a reverse voltage is being applied to low-voltage error lamps.

Figure 6:
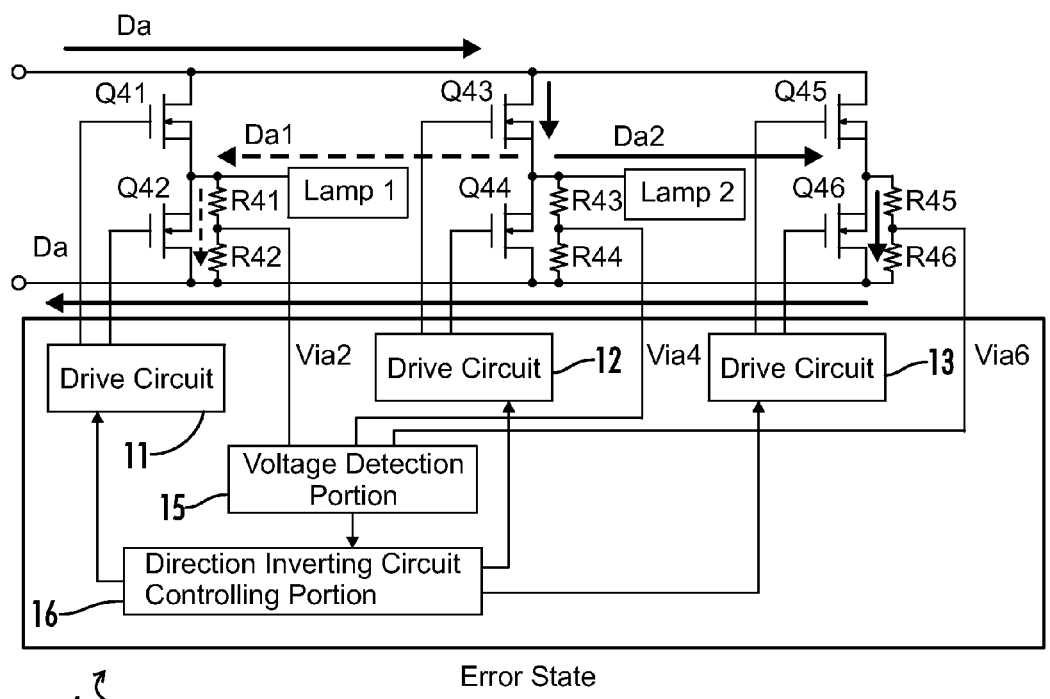
FIG. 6 is a circuit diagram showing an error state (error in Lamp 1) of the direction inverting circuit 4 of FIG. 3.

Referring now to FIG. 6, operation in a case in which Lamp 1 is suffering from a low-voltage error is further described. When there is no problem (during a constant connection), Q41 and Q46 are ON while the rest are OFF, as in FIG. 4. Lamp 1 and Lamp 2 are connected in series, and the current is flowing from Q41 to Q46. The current I1a is controlled so as to be the rated current by the step-down chopper circuit 2.

When Lamp 1 undergoes an error and the impedance begins to drop, the lamp voltage falls, and a low-voltage error is detected due to the drop in the lamp voltage (V1a2-V1a4) below a predetermined voltage which is lower than the lamp voltage when constantly on.

When the low-voltage error in Lamp 1 is detected, Q43 is turned ON, Q41 is turned OFF, and Q42 is turned ON and OFF intermittently. Q46 is maintained ON. The frequency of the intermittent drive is a frequency sufficient to prevent blinking of the lamps from being noticeable (e.g. a few kHz from several hundred Hz).

In this case, when Q42 is ON, a reverse voltage is applied to Lamp 1, and when Q42 is OFF, Lamp 2 is turned ON. Q44 is used to apply a reverse current to Lamp 1 and a forward current to Lamp 2. The lamp voltage for Lamp 1 can be calculated with V1a4-V1a2, and therefore when the lamp voltage rises to a value near the constant voltage, Lamp 1 is deemed to have been restored to normal, and the system returns to the status described in FIG. 4.

In other words, when there is an error with Lamp 2 (FIG. 5) Q41 and Q44 are constantly ON, when Q45 is ON a reverse voltage is applied to Lamp 2, and when Q45 is OFF Lamp 1 is turned on. Q44 applies the on current for Lamp 1 and the reverse-voltage current for Lamp 2 (but not at the same time). On the other hand, when there is a problem with Lamp 1 (FIG. 6), Q43 and Q46 are constantly ON, when Q42 is ON a reverse voltage is applied to Lamp 1, and when Q42 is OFF Lamp 2 is turned on. Q43 applies the on current for Lamp 2 and the reverse-voltage current for Lamp 1 (but not at the same time).

Thus, the light emitting device 100 according to the present embodiment is provided with the direction inverting circuit 4 for applying a reverse voltage to lamps in which an error has been detected when an error is detected in any of the plurality of lamps, and applying a forward voltage to lamps detected to have a normal state when a normal state is detected in lamps to which a reverse voltage has been applied, and therefore it is possible to restore to normal state even if errors occur in lamps.

Furthermore, the direction inverting circuit controlling portion 16 is provided for turning on and off the plurality of switches based on the voltages of the plurality of lamps detected by the voltage detecting portion 15, and therefore it is possible to restore lamps to a normal state even if errors occur, by applying a temporary reverse voltage to lamps that are suffering from an error, and restoring portions in which impedances dropped by applying a current.

Furthermore, the switch pairs Q43 and Q44 includes switches used for applying both the forward current flowing to normal-state lamps and a reverse current flowing to problem lamps, and therefore it is possible to maintain other normal-state lamps on while a reverse voltage is being applied to low-voltage error lamps.

In an alternative embodiment as shown in FIGS. 8-11, a direction inverting circuit 4 is disclosed in which Lamps 1-3 are connected in series. The direction inverting circuit 4 of the present embodiment is comprised of switches Q41-Q48, voltage detecting circuits R41-R48, a voltage detecting portion 15 for calculating lamp voltage based on drive circuits 11-14 of the switches Q41-Q48 and the voltage detecting circuits R41-R48, and the direction inverting circuit controlling portion 16 for turning the switches Q41-Q48 ON/OFF based on the results of the voltage detecting circuit 15.

Figure 8:
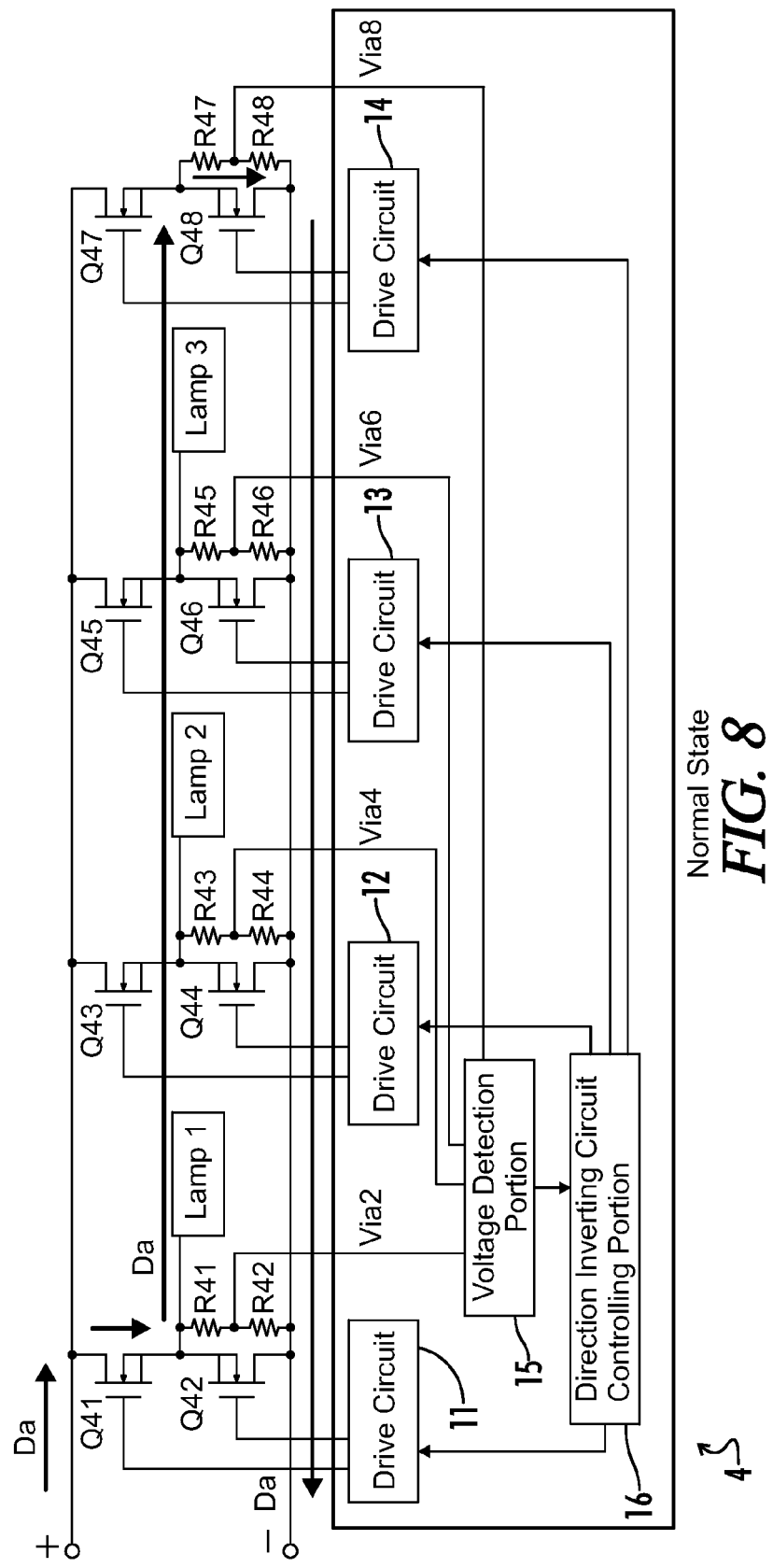
FIG. 8 is a circuit diagram showing a normal state (constant connection) of the direction inverting circuit 4 in an alternative embodiment of the present invention.
Figure 9:
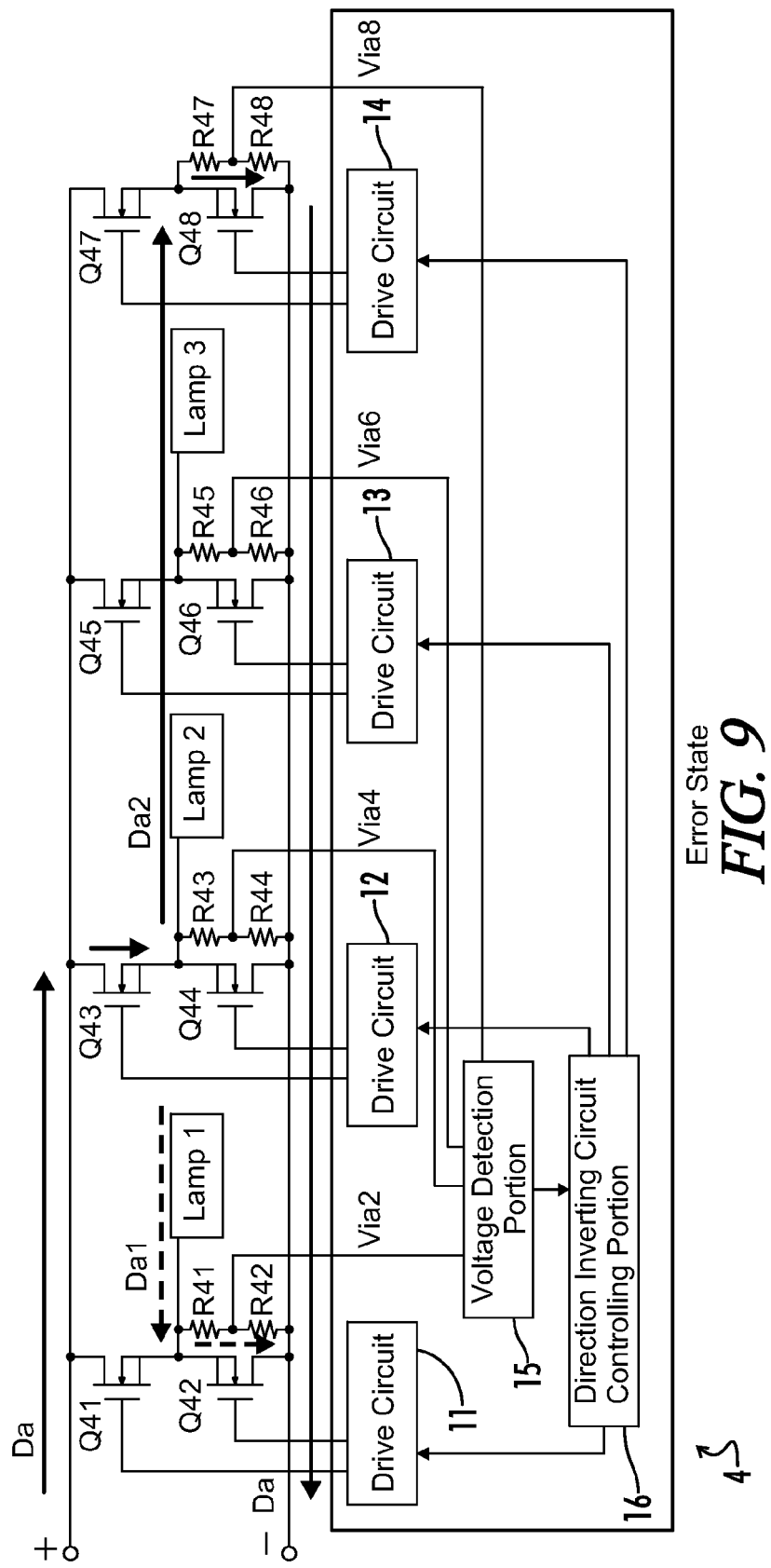
FIG. 9 is a circuit diagram showing an error state (error in Lamp 1) of the direction inverting circuit 4 in the embodiment of FIG. 8.

Referring specifically to FIG. 8, Q41 and Q48 are ON and the rest are OFF when the direction inverting circuit 4 is in the normal-state (normal connection). A Lamp 1, a Lamp 2, and a Lamp 3 are connected in series, and the current flows from Q41 to Q48. The current I1a is controlled so as to be the rated current by the step-down chopper circuit 2.

FIG. 9a shows a case in which Lamp 1 is in error. When Lamp 1 suffers an error and the impedance drops, the lamp voltage drops and a low-voltage error is detected by the lamp voltage (V1a2-V1a4) dropping below a predetermined voltage which is lower than the normal lamp voltage.

When the low-voltage error in Lamp 1 is detected, Q43 is turned ON, Q41 is turned OFF, and Q42 is turned ON/OFF intermittently. Q48 is maintained ON. The frequency of the intermittent drive is a frequency sufficient to prevent blinking of the lamps from being noticeable (e.g. a few kHz from several hundred Hz).

In this case, when Q42 is ON, a reverse voltage is applied to Lamp 1, and when Q42 is OFF, the Lamps 2 and 3 are turned on. Q43 is used to apply a reverse current to Lamp 1 and a forward current to the Lamps 2 and 3. The lamp voltage for Lamp 1 can be calculated with V1a4-V1a2, and therefore when the lamp voltage rises to a value near the constant voltage, Lamp 1 is deemed to have been restored to normal, and the connection shown in FIG. 8 is restored.

Figure 10:
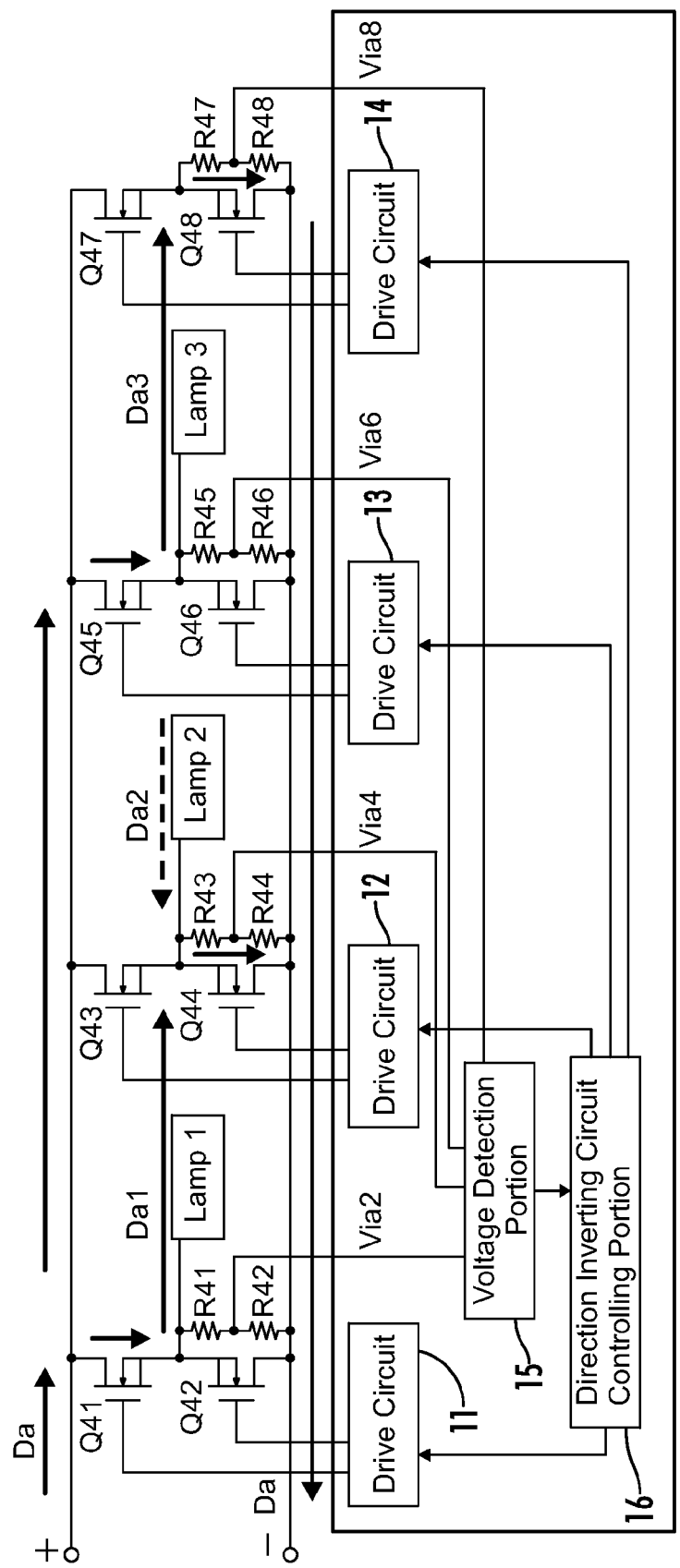
FIG. 10 is a circuit diagram showing an error state (error in Lamp 2) of the direction inverting circuit 4 in the embodiment of FIG. 8.

FIG. 10 shows a case in which Lamp 2 is an error. When Lamp 2 suffers an error and the impedance drops, the lamp voltage drops and a low-voltage error is detected by the lamp voltage (V1a4-V1a6) dropping below a predetermined voltage that is lower than the normal lamp voltage.

When a low-voltage error is detected in Lamp 2, Q41 and 48 are maintained always ON, and Q44 and 45 are turned ON/OFF intermittently. The frequency of the intermittent drive is a frequency sufficient to prevent blinking of the lamps from being noticeable (e.g. a few kHz from several hundred Hz).

In this case, when Q44 and 45 are ON, a reverse voltage is applied to Lamp 2, and when Q44 is ON and Q45 is OFF, only Lamp 1 is turned on, and when Q44 is OFF and Q45 is ON, only Lamp 3 is turned on. Q44 and 45 are used to apply a reverse current to Lamp 2 and a forward current to Lamps 1 and 3. The lamp voltage for Lamp 2 can be calculated with V1a6-V1a4, and therefore when the lamp voltage rises to a value near the constant voltage, Lamp 2 is deemed to have been restored to normal, and the connection in FIG. 8 is restored.

Figure 11:
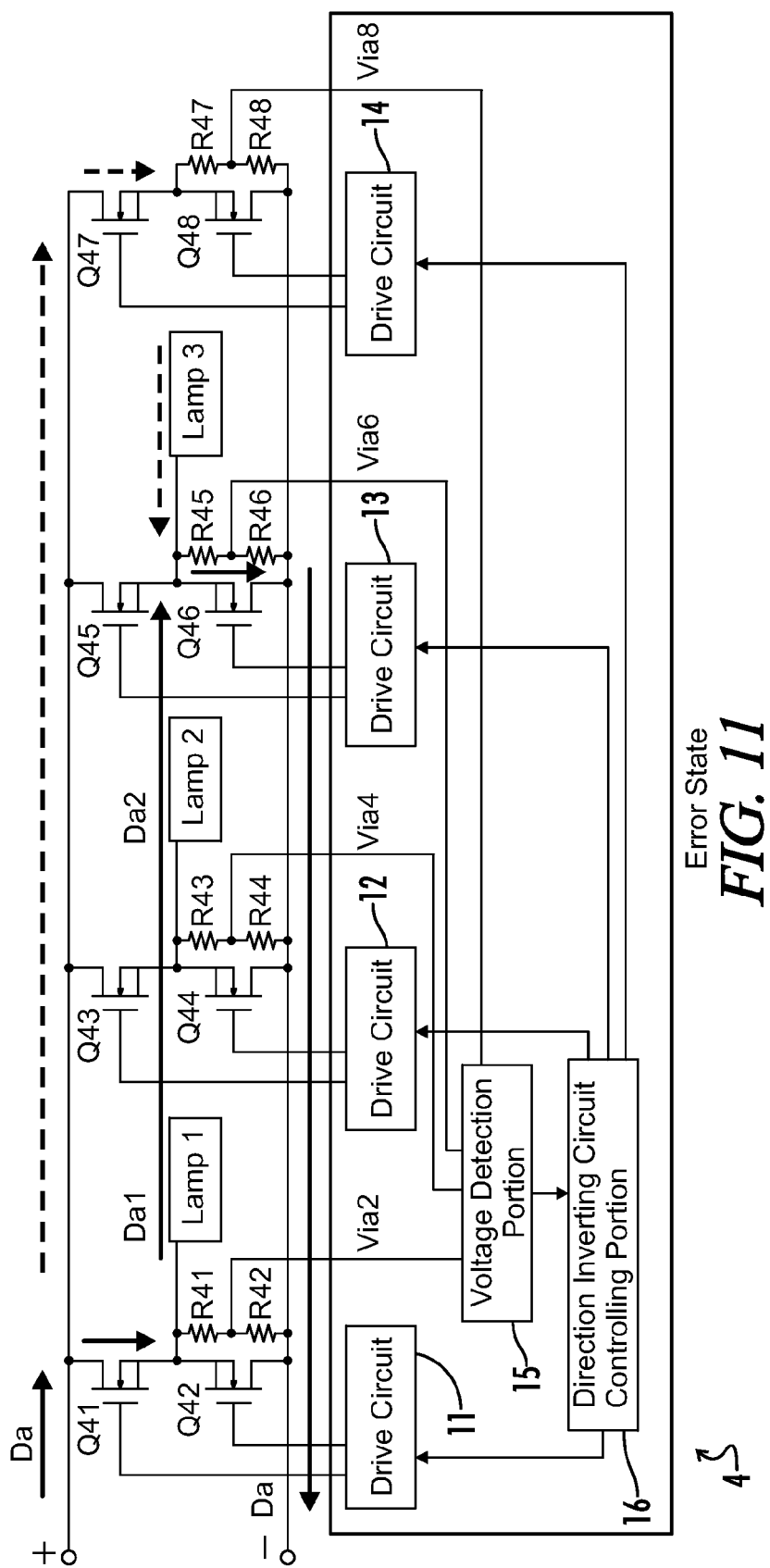
FIG. 11 is a circuit diagram showing an error state (error in lamp 3) of the direction inverting circuit 4 in the embodiment of FIG. 8.

FIG. 11 shows a case in which Lamp 3 is an error. When Lamp 3 suffers an error and the impedance drops, the lamp voltage drops and a low-voltage error is detected by the lamp voltage (V1a6-V1a8) dropping below a predetermined voltage which is lower than the normal lamp voltage.

When a low-voltage error is detected in Lamp 3, Q46 is turned ON, and Q48 is turned OFF, and Q47 is turned ON/OFF intermittently. Q41 is maintained ON. The frequency of the intermittent drive is a frequency sufficient to prevent blinking of the lamps from being noticeable (e.g. a few kHz from several hundred Hz).

In this case, when Q47 is ON, a reverse voltage is applied to Lamp 3, and when Q47 is OFF, Lamps 1 and 2 are turned on. Q46 is used to apply a reverse current to Lamp 3 and a forward current to Lamps 1 and 2. The lamp voltage for Lamp 3 can be calculated with V1a8-V1a6, and therefore when the lamp voltage rises to a value near the constant voltage, Lamp 3 is deemed to have been restored to normal, and the connection in FIG. 8 is returned to.

Cases in which each of Lamps 1, 2, and 3 (in a case in which n=3) suffer errors have been described above. In a case in which the number of lamps is greater than n=3, control may be provided such that either or both of the low-side switch (connected to the negative pole of the power source) on the positive pole side of the problem lamp and the high-side switch (connected to the positive pole of the power source) on the negative pole side are operated intermittently, and that either or both of the switches apply both a forward current to normal-state lamps in the reverse current to problems.

Thus, the light emitting device 100 of a particular embodiment can include n lamps connected in series, in which case the direction inverting circuit 4 includes (n+1) switch pairs connected in series between power sources, and the n lamps are connected in a series connection with the (n+1) switch pairs, and therefore it is possible to reduce the number of switches contained in the light emitting device 100.

Figure 12:
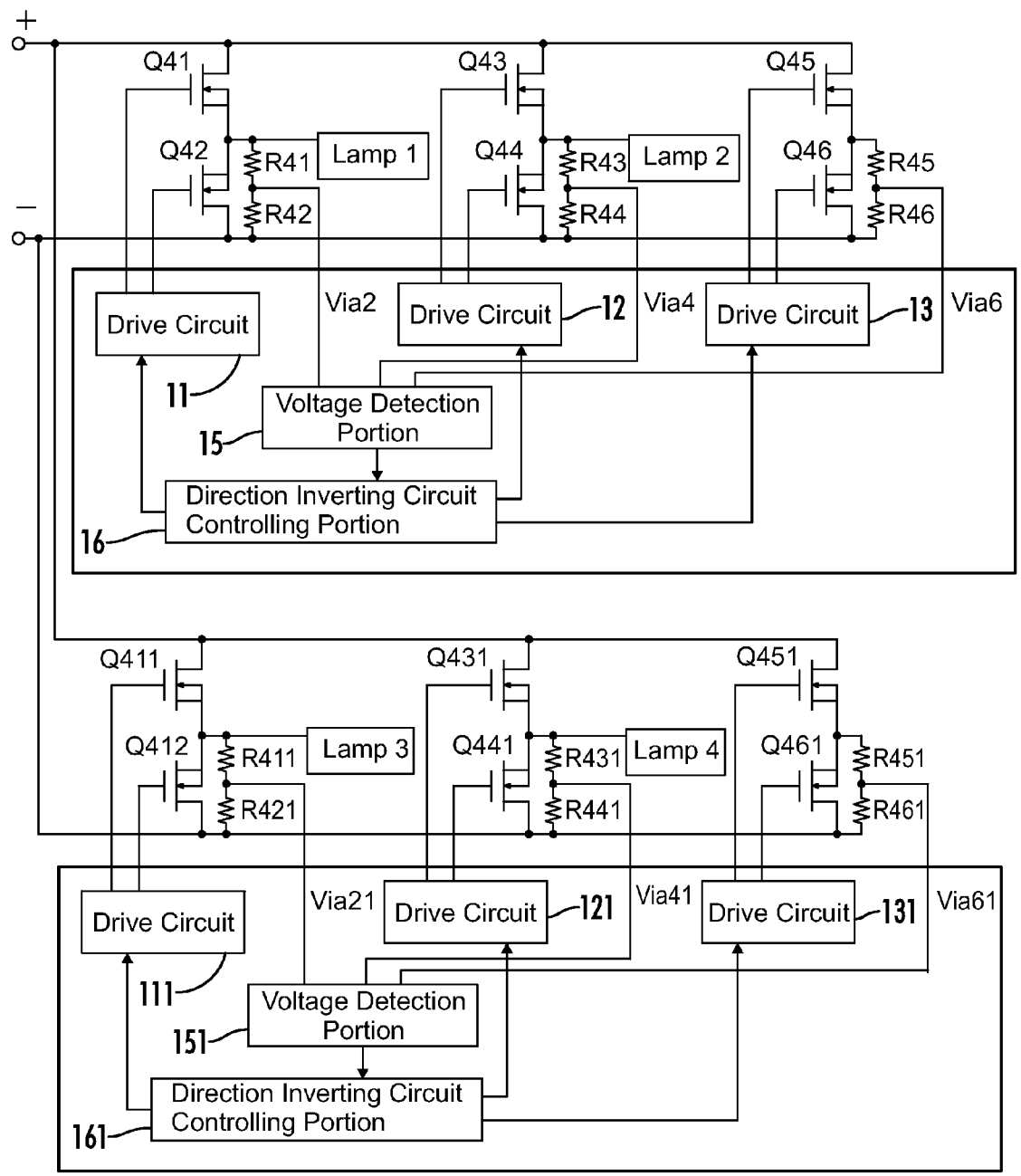
FIG. 12 is a circuit diagram showing a direction inverting circuit 4 in another alternative embodiment of the present invention.

Another embodiment is described herein, with reference to FIG. 12. The circuit of this embodiment generally comprises the circuits of FIGS. 1-7, and therefore further explanation of these portions is omitted. FIG. 12 shows an example in which a series-connection circuit comprising Lamps 1 and 2 and a series-connection circuit comprising Lamps 3 and 4 are connected in parallel. The series-connection circuit having Lamps 3 and 4 substituted for Lamps 1 and 2 has substantially similar operation and composition. As operation of these circuits is unchanged from previous descriptions, further discussion therefore is omitted.

An example is described of a lamp constituted by a plurality of organic electroluminescent elements. Five organic electroluminescent elements requiring a rated voltage of 7 V are connected in series, and therefore the rated voltage per lamp is 35 V and the rated current is 400 mA. Since two lamps are connected in series, the input voltage of the direction inverting circuit 4 is approximately 70 V. The input current of the direction inverting circuit 4 is 800 mA.

The number of switches in the direction inverting circuit 4 in which a further two sets of two lamps connected in series are connected in parallel is 12, making it possible to reduce the number of direction inverting circuits per lamp by four. In a case in which n lamps are connected in series and in m rows, the number of switches in the direction inverting circuit 4 is m×(2n+2), and can therefore be reduced by m×(2n-2). Accordingly, an organic electroluminescent light emitting device and lighting apparatus can be provided in which the number of switches in the direction inverting circuit 4 can be reduced, and having functionality for restoring to a normal-state even if a low-voltage error occurs.

Figure 13:
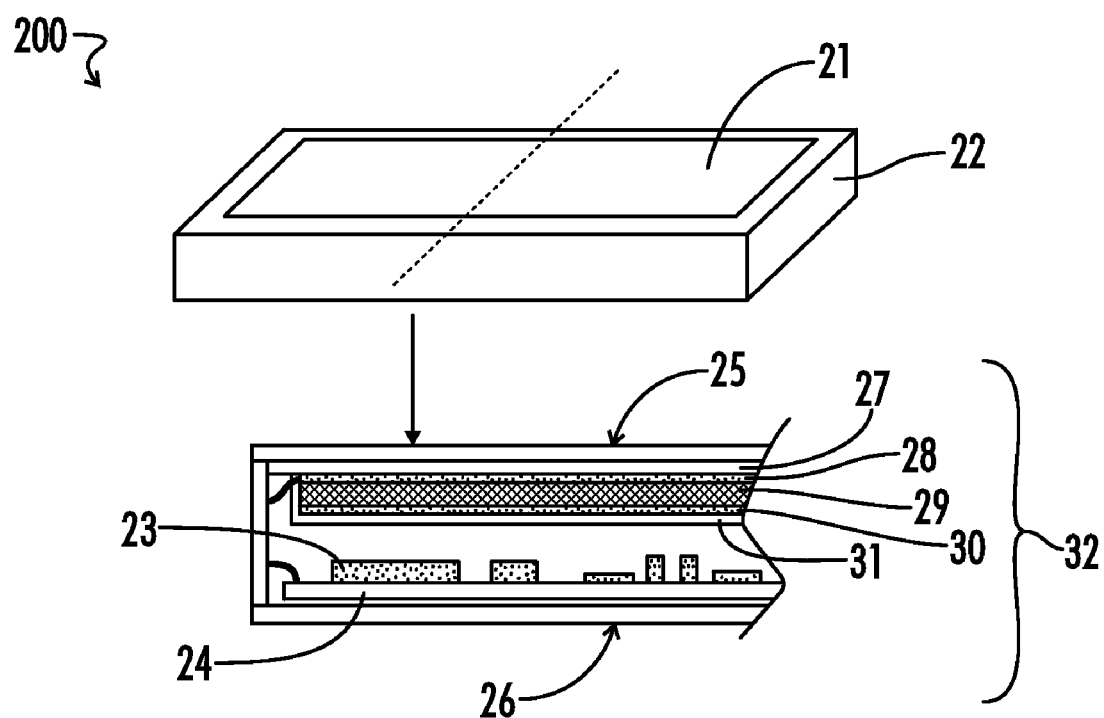
FIG. 13 shows an organic electroluminescent lighting apparatus used in an embodiment of the present invention.

An organic electroluminescent element lighting apparatus used in the present invention is described below, with reference to FIG. 13. An organic electroluminescent element lighting apparatus 200 is constituted by an organic electroluminescent element 32 constituted by a glass substrate 27, a protective glass 31, an ITO (positive pole) 28, an organic light emitting layer 29, an aluminum electrode (negative pole) 30, and a light emitting device and case 22 for the organic electroluminescent element 32. 21 is a light emitting surface, 25 is a top surface of a case, and 26 is a bottom surface of a case. A circuit containing the direction inverting circuit of the light emitting device described in the first through third embodiments is constituted by a power supply portion (not shown in the drawings) for supplying power, an electrical part 23, and a printed substrate 24.

Accordingly, an organic electroluminescent lighting apparatus 200 can be provided in which the number of switches included in the organic electroluminescent lighting apparatus 200 is reduced, which has functionality for restoring to a normal state even if low-voltage errors occur, and which can maintain other normal-state lamps on, while a reverse voltage is being applied to lamps in which problems have occurred.

Note that in the disclosed embodiments, cases were described in which an organic electroluminescent element was used as a light emitting element, but the present invention is not limited to organic electroluminescent elements, and can naturally be applied to other elements which can be refreshed by restoring insulation faults, such as inorganic electroluminescent elements, LEDs, and other elements which emit light by applying a voltage between electrodes.

Furthermore, in the disclosed embodiments a lighting apparatus was described, but the present invention is not limited to lighting apparatuses, and can naturally be applied to various types of light sources, such as light sources for exposure.

The present invention can be used as an organic electroluminescent light emitting device and lighting apparatus having functionality for restoring to a normal state even if a low-voltage error occurs, by temporarily applying a reverse voltage to a light emitting element in which a low-voltage error has occurred using a direction inverting circuit, in order to restore portions in which impedance has fallen by applying a current.

Thus, although there have been described particular embodiments of the present invention of a new and useful Organic Electroluminescent Light Emitting Device for Restoring Normal Operation After Low-Voltage Errors, it is not intended that such references be construed as limitations upon the scope of this invention except as set forth in the following claims.

What is claimed is:

1. A light emitting device having a plurality of lamps and operable to maintain normal operation after the occurrence of a low-voltage error in one or more of the lamps, the device comprising:
    a control power source circuit coupled to a commercial alternating-current power source and operable to generate a control direct-current voltage;
    a step-down chopper circuit coupled to the control power source circuit and further comprising a switching element;
    a lamp current detecting circuit;
    a control circuit operable to receive the control direct-current voltage from the control power source circuit and to output a control signal to the switching element of the step-down chopper circuit, wherein the control signal drives the switching element and supplies power to the lamps; and
    a direction inverting circuit comprising a plurality of pairs of switching elements connected in parallel, each pair connected in series between the positive and negative poles of the power supply, the direction inverting circuit further comprising the plurality of lamps, each lamp connected between one pair of switching elements,
    wherein the direction inverting circuit is operable to control the plurality of switching element pairs and apply a reverse voltage to lamps in which a low-voltage error has been detected, and further operable to apply a forward voltage to lamps in which a normal state has been detected.

2. The device of claim 1, wherein the lamps further comprise organic electroluminescent elements.

3. The device of claim 1, wherein a low-voltage error comprises a detected voltage that is less than or equal to a predetermined voltage, and a normal state comprises a detected voltage that is greater than a predetermined voltage.

4. The device of claim 1, wherein a low-voltage error comprises a detected voltage that is less than a predetermined voltage, and a normal state comprises a detected voltage that is greater than or equal to a predetermined voltage.

5. The device of claim 1, wherein a first portion of the direction inverting circuit comprises a first plurality of pairs of switching elements connected in parallel, each pair connected in series between the positive and negative poles of the power supply, the first portion of the direction inverting circuit further comprising at least some of the plurality of lamps, each of said lamps connected between one of said pair of switching elements in the first plurality of switching elements,
    wherein a second portion of the direction inverting circuit comprises a second plurality of pairs of switching elements connected in parallel, each pair connected in series between the positive and negative poles of the power supply, the second portion of the direction inverting circuit further comprising at least some of the plurality of lamps, each of said lamps connected between one of said pair of switching elements in the second plurality of switching elements, and
    wherein the first and second portions of the direction inverting circuit are coupled.

6. A light emitting device comprising:
    a direct-current power source circuit having positive and negative poles and operable to supply at least a certain current;
    a plurality of light emitting elements comprising first and second light emitting elements coupled in series and operable to emit light upon receiving a supply of direct-current current; and
    a direction inverting circuit including first, second, and third pairs of switching elements coupled in series between the power source positive and negative poles, the first light emitting element being connected between series contacts of the first and second pairs of switching elements, the second light emitting element being coupled between series contacts of the second and third pairs of switching elements,
    the direction inverting circuit effective to determine a direction of current allocated to each of said first and second light emitting elements and a direction of current applied to each of said first and second light emitting elements,
    wherein when a low-voltage error is detected in any of the plurality of light emitting elements, the direction inverting circuit applies a reverse voltage to the light emitting elements in which the low-voltage error has been detected, and
    wherein when a normal state of a light emitting element to which the reverse voltage has been applied is detected, the direction inverting circuit applies a forward voltage to the light emitting elements in which the normal state has been detected.

7. The light emitting device according to claim 6, wherein:
    the second pair of switching elements includes a switching element operable to cause a forward current flowing to normal state light emitting elements to flow and further operable to cause a reverse current flowing to problem light emitting elements to flow.

8. The light emitting device according to claim 6, wherein the light emitting elements further comprise organic electroluminescent elements.

9. A light emitting device comprising:
    a direct-current power source circuit effective to supply at least a certain current;
    a plurality of light emitting elements effective to emit light upon receiving a supply of direct-current current; and
    a direction inverting circuit further comprising
        a plurality of switching elements effective to switch the direction of the current applied to the plurality of light emitting elements,
        a voltage detecting portion effective to detect the voltage of the plurality of light emitting elements, a direction inverting circuit controlling portion effective to provide one or more signals to turn on and off the plurality of switching elements based on the voltage of the plurality of light emitting elements detected by the voltage detecting portion, and one or more drive circuits, each drive circuit operable to drive a plurality of associated switching elements according to a signal from the direction inverting circuit controlling portion;

the direction inverting circuit effective to determine a direction of current allocated to each light emitting element and a direction of current applied to each light emitting element, wherein when a low-voltage error is detected in any of the plurality of light emitting elements, the direction inverting circuit applies a reverse voltage to the light emitting elements in which the low-voltage error has been detected, and wherein when a normal state of a light emitting element to which the reverse voltage has been applied is detected, the direction inverting circuit applies a forward voltage to the light emitting elements in which the normal state has been detected.

10. The light emitting device according to claim 9, wherein:

the voltage detecting portion detects low-voltage errors in any of the plurality of light emitting elements; and the direction inverting circuit controlling portion intermittently applies reverse voltage to light emitting elements in which a low-voltage error has been detected.

11. The light emitting device according to claim 10, wherein low-voltage errors comprise detected voltages that are less than or equal to a predetermined voltage.

12. The light emitting device according to claim 11, wherein the predetermined voltage is less than a voltage for normal lamp operation.

13. The light emitting device according to claim 9, wherein:

the plurality of light emitting elements further comprises a number n of lamps connected in series; and the direction inverting circuit further comprises a number (n+1) of pairs of switching elements connected in series between power sources, the n lamps being connected between series contacts of (n+1) pairs of switching elements.

14. The light emitting device according to claim 13, wherein:

if the switching element connecting a positive pole side of a problem light emitting element and a negative pole of the power source is a low-side switch, and the switching element connecting a negative pole side of the problem light emitting element and a positive pole of the power source is a high-side switch;

the direction inverting circuit controlling portion causes either or both of the low-side switch and the high-side switch to operate intermittently, thus applying a reverse voltage to problem light emitting elements intermittently.

15. The light emitting device according to claim 14, wherein:

either or both of the low-side switch and the high-side switch are controlled so as to apply a forward current to normal light emitting elements in the reverse current to problem light emitting elements.

16. The light emitting device according to claim 13, wherein:

the direction inverting circuit including n light emitting elements connected in series and (n+1) switch pairs connected in series between power sources further comprises a connection of m rows.

17. The light emitting device according to claim 9, wherein the light emitting elements further comprise organic electroluminescent elements.

18. A method of restoring normal operation to a light emitting device having a plurality of light emitting elements after the occurrence of a low-voltage error in one or more of the light emitting elements, the method comprising:

(a) providing a supply of direct-current current to the plurality of light emitting elements;

(b) detecting a voltage applied to each of the plurality of light emitting elements;

(c) comparing each detected voltage to a predetermined voltage representative of a low-voltage error;

(d) reversing the direction of the current provided to any light emitting element having a forward current flow upon detecting a voltage applied to said light emitting element less than or equal to the predetermined voltage;

(e) reversing the direction of the current provided to any light emitting element having a reverse current flow upon detecting a voltage applied to said light emitting element greater than the predetermined voltage.

19. A method of restoring normal operation to a light emitting device having a plurality of light emitting elements after the occurrence of a low-voltage error in one or more of the light emitting elements, the method comprising:

(a) providing a supply of direct-current current to the plurality of light emitting elements;

(b) detecting a voltage applied to each of the plurality of light emitting elements;

(c) comparing each detected voltage to a predetermined voltage representative of a low-voltage error;

(d) reversing the direction of the current provided to any light emitting element having a forward current flow upon detecting a voltage applied to said light emitting element less than the predetermined voltage;

(e) reversing the direction of the current provided to any light emitting element having a reverse current flow upon detecting a voltage applied to said light emitting element greater than or equal to the predetermined voltage.

* * * * *